United States Patent [19]

Zorian

[11] Patent Number: 5,107,501
[45] Date of Patent: Apr. 21, 1992

[54] BUILT-IN SELF-TEST TECHNIQUE FOR CONTENT-ADDRESSABLE MEMORIES

[75] Inventor: Yervant Zorian, Princeton, N.J.

[73] Assignee: AT&T Bell Laboratories, Murray Hill, N.J.

[21] Appl. No.: 502,965

[22] Filed: Apr. 2, 1990

[51] Int. Cl.$^5$ ............................................. G11C 29/00
[52] U.S. Cl. ..................................................... 371/213
[58] Field of Search .................... 371/21.3, 21.2, 21.1, 371/25.1, 27; 365/49

[56] References Cited

U.S. PATENT DOCUMENTS

| | | | |
|---|---|---|---|
| 3,420,991 | 1/1969 | Ling | 371/21.3 |
| 3,800,286 | 3/1974 | Brown et al. | 340/172.5 |
| 4,377,855 | 3/1983 | Lavi | 365/49 |
| 4,532,606 | 7/1985 | Phelps | 365/49 |
| 4,559,618 | 12/1985 | Houseman et al. | 365/49 |
| 4,661,930 | 4/1987 | Tran | 371/21.3 |
| 4,680,760 | 7/1987 | Giles et al. | 371/21.1 |
| 4,729,117 | 3/1988 | Osaka | 371/21.1 |
| 4,862,071 | 8/1989 | Sato et al. | 371/21.1 |
| 4,896,322 | 1/1990 | Kraus et al. | 371/21.2 |
| 4,912,710 | 3/1990 | Rolfe | 371/21.1 |

*Primary Examiner*—Jerry Smith
*Assistant Examiner*—Phung My Chung

[57] ABSTRACT

All elements of a Content-Addressable Memory (CAM) (10) are tested by executing a predetermined set of sequences of the write and match-read operations. During each write operation, a separate one of a set of data words, consisting of the group of all zeros, all ones, a walking ones in a zero word, and a walking zero in a ones word, is written into the CAM for entry in each successive one of its rows of memory cells (14). During each match/read operation, a separate data word from this group is matched to a word stored in each of the rows while, simultaneously, a read operation is performed and the contents of a successive row are read to check for correspondence with a particular data word. A particular set of seven sequences of write and match/read operations is capable of achieving such testing.

11 Claims, 1 Drawing Sheet

BUILT-IN SELF-TEST TECHNIQUE FOR CONTENT-ADDRESSABLE MEMORIES

TECHNICAL FIELD

This invention relates generally to a technique for accomplishing built-in self-testing of a content-addressable memory.

BACKGROUND OF THE INVENTION

There is a trend within the semiconductor industry towards designing semiconductor structures with the capability of testing themselves (built-in self-test). Providing a complex, very large scale integrated circuit with built-in self-test capability allows very high fault coverage to be obtained without the need for sophisticated test equipment. Presently, there does not exist a single generic technique capable of accomplishing built-in self-testing of different types of structures (e.g., RAMs, ROMs, FIFOs etc.). Thus, separate built-in self-test techniques are required for such different functional structures.

While built-in self-test techniques are known to exist for most types of functional semiconductor structures, there exists one type of functional structure, the Content Addressable Memory (CAM) for which no built-in self-test technique is known to exist. CAMs are similar to conventional Random Access Memories (RAMs) in that they contain a matrix array of memory cells into which data can be written, or from which data can be read, in a random fashion. In addition, CAMs also contain a plurality of exclusive OR (XOR) gates, each gate being associated with a separate one of the memory cells in each row of the array. The XOR gates associated with the memory cells in each row have their outputs ANDed with each other, providing the CAM with the advantage of matching a word (referred to as a "match word") to the word stored in each row of the array. In addition, some CAMs also offer a feature known as a "wild card" which allows masking of selected bits of the match word.

The matching and wild card features of present day CAMs cause them to be more complex as compared to other types of memories such as RAM. For that reason, present day built-in self-tests techniques used for RAMs are not proper for CAMs. Further, there is no known single built-in self-test technique which has provided effective for testing all of the features of the CAMs (including matching and the wild card).

Thus, there is a need for technique for accomplishing built-in self-testing of a CAM.

SUMMARY OF THE INVENTION

Briefly, in accordance with the invention, a method is disclosed for testing a content-addressable memory comprised of an array of complex cells each having a memory portion and an associated exclusive OR (XOR) gate) and a set of associated blocks. The method of the invention is carried out by performing a predetermined set of sequences of write, match and read operations on the CAM to collectively test all the elements thereof. During each write operation, a predetermined data word from the group consisting of all zeros, all ones, a working zero in a ones word, or a walking one in a zeros word, is written into a successive one of the rows of memory cells in the array. Each match operation is performed by entering a predetermined one of the data words in the group into the match register for matching the word written in every row of cells in the CAM array. Each read operation is carried out by reading the contents of a successive row of cells and then examining the contents to determine whether the word just read corresponds to a predetermined one of the group of data words. In a preferred embodiment, the match and read operations are carried out simultaneously so that as the match word is being matched to the contents of all the rows, a successive row of cells is being read. Based on the results of the write and match operations, the operability of each of the elements of the CAM can be verified.

In a preferred embodiment, the following set of seven sequences of write and match and read operations is performed:

TABLE I

| (1) | ↑ $W^0$ | | | |
|---|---|---|---|---|
| (2) | ↑ $M^{1/0}$ | $W^1$ | $W^0$ | $W^1$ |
| (3) | →($M^{0→}$) | $W^1$ | | |
| (4) | ↑ $M^1$ | $W^0$ | $M^0$ | $W^1$ |
| (5) | ↑ $M^1$ | $W^0$ | $W^1$ | $W^0$ |
| (6) | →($M^{1→}$) | $W^0$ | | |
| (7) | ↓ $M^0$ | $W^1$ | $M^1$ | $W^0$ | where W signifies a write and M signifies a match/read operation (during which both matching and reading occur), respectively, and the superscripts 0, 1,→ and 1→ signify that the particular operation is performed by either writing or matching/reading an all-zeros word, all-ones word, a waling zero in a ones word, and a waling one in an all-zeros word, respectively. In the case where there are two superscripts associated with the match/read operation, the first superscript identifies the match word while the second identifies the word expected to be read. In the case of a single subscript, the word matched is the same as the word which is expected to be read out from the row of cells. The upward and downward arrows signify that the particular sequence of operations which follows the arrow is performed on each successive row of the array, starting with the first or last row, depending on whether the arrow is directed upward or downward, respectively.

By way of explanation, the first operation (1) consists of a single write operation ($W^0$) during which an all-zeros word is written into each successive row of the memory cells in the array, starting with the first row. The second sequence (sequence (2)) comprises a match/read operation ($M^{1/0}$), a write operation ($W^1$), a write operation ($W^0$) and a write operation ($W^1$) which are executed in succession on each successive row of cells. The match/read operation $M^{1/0}$ is carried out by matching a word of all ones to the words stored in the array while simultaneously reading the word stored in a successive row to determine if the word is one of all zeros. Each write operation (W) in sequence (2) is carried out by writing either a word of all ones or all zeros, depending on the superscript designation associated with the particular write operation, into the row of cells just read during the match/read operation. The sequences (4),(5) and (7) also comprise a set of write and match/read operations which are executed in succession on each successive row of memory cells. Unlike the sequences (2),(4),(5) and (7), the sequences (3) and (6) are carried out by matching/reading, not a single word of ones or zeros, but a string of words obtained by walking (shifting) a zero through a ones word and by walking a one through a zeros word, respectively. By performing the match/read operations ($M^0 \rightarrow$ and $M^1 \rightarrow$) during the sequences (3) and (6), respectively, the matching function of the CAM will be advantageously tested.

By executing the above-described sequences (1)-(7) of the write and match/read operations, all of the elements of the CAM will be thoroughly tested. Thus, the instant technique of testing a CAM assures 100% possible fault coverage.

DETAILED DESCRIPTION

Figure 1:
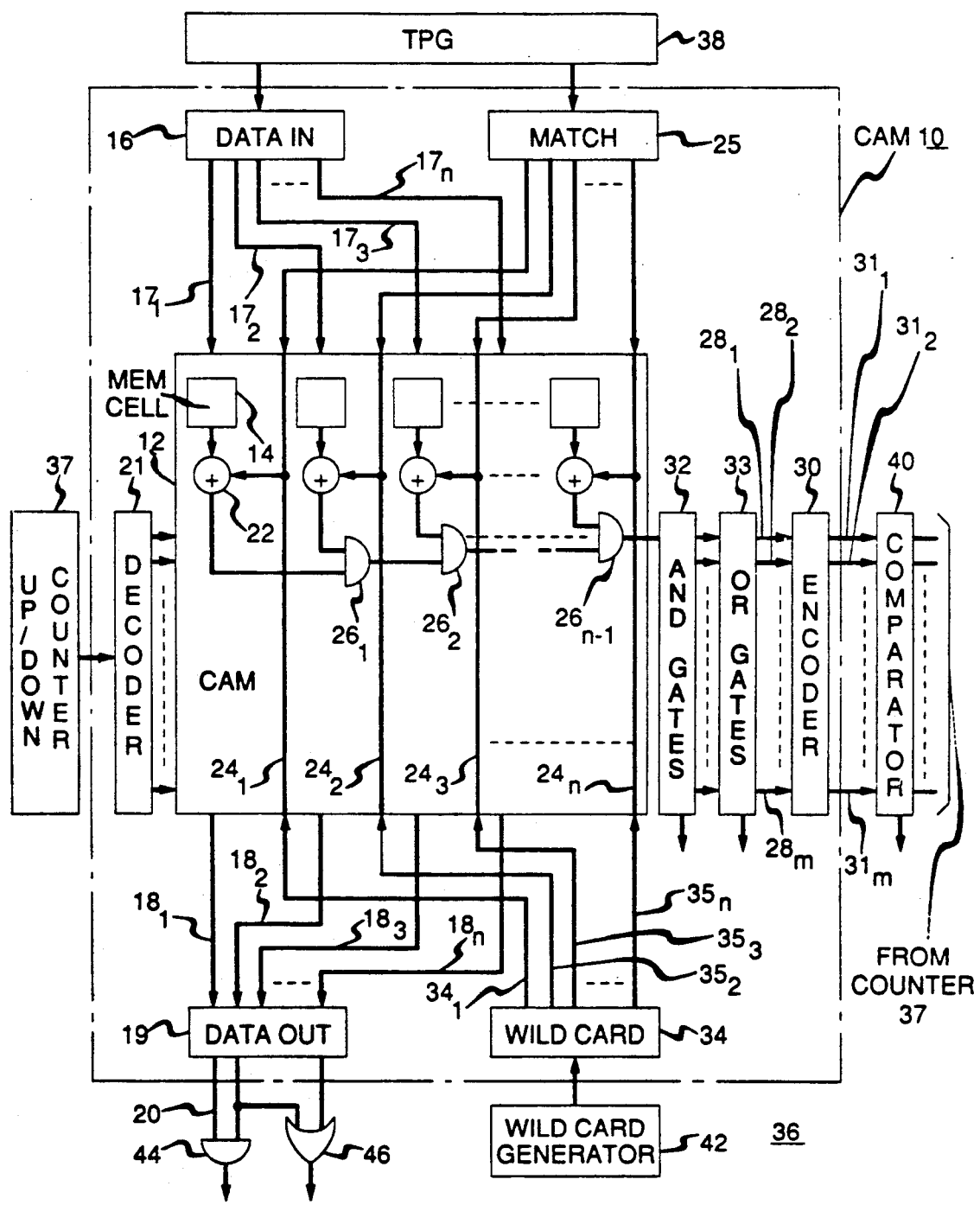
FIG. 1 is a block schematic diagram of a content-addressable memory (CAM) and an apparatus, in accordance with the invention, for accomplishing built-in self-testing of the CAM.

FIG. 1 shows a block diagram of a content-addressable memory 10 as is well known in the art. The CAM 10 is comprised of an m row by n column array 12 of memory cells 14, where m and n are integers (only one such row of cells being shown). Each of the memory cells 14 in each row in the array 12 stores a separate one of the n bits of a word first entered into a DATA-IN register 16 and then transmitted to the cells in the row via a separate one of a set of register output lines $17_1, 17_2, 17_3 \ldots 17_n$, respectively. The word stored in each row of cells 14 can be read from the array 12 via a separate one of a set of lines $18_1, 18_2, 18_3 \ldots 18_n$ which are coupled to a DATA-OUT register 19. Data stored in the DATA-OUT register 19 is output via a bus 20 to an external device (not shown). The identity of the row of cells 14 into which a data word is to be written, or from which a stored data word is to be read, is established in accordance with the row address input to a decoder 21 associated with the CAM 10. The decoder 21 decodes the address to establish the row identify and then renders the cells in the addressed row operative to read or write data (in the form of an n bit word).

Unlike other types of memory devices, the CAM 10 affords an associative addressing capability, i.e., the ability to match a string of n bits to the data word stored in each row of cells 14 in the array 12 so as to identify the address of the row(s) which matches. The trig of n bits to be matched is hereinafter referred to as the "match word." To accomplish associative addressing, a separate, exclusive OR(XOR) gate 22 is associated with each memory cell 14 within the array 12. Each XOR gate 22 associated with a cell 14 in each column in the array 12 exclusively OR's the contents of its associated cell with the bit on a separate one of a set of lines $24_1, 24_2, 24_3 \ldots 24_n$, each line being fed with a separate one of the bits of a match word held in a MATCH register 25 associated with the CAM 10.

The results of the exclusive OR operation performed by each XOR gate 22 associated with a cell 14 in a particular row of cells 14 is ANDed, via a separate one of a set of AND gates $26_1, 26_2 \ldots 26_{n-1}$, with the output signal of the XOR gate immediately to the left thereof (i.e., the XOR gate associated with the preceding column) in the same row. The output signal from the AND gate $26_{n-1}$ lying in each row of cells 14 (representing the ANDed sum of the output signals of the gates $26_1 - 26_{n-1}$ in the row) is applied to a separate one of a set of input lines $28_1, 28_2 \ldots 28_m$, of an encoder 30. In response to the signal on the input lines $28_1 - 28_m$, the encoder 30 provides a signal on its output lines $31_1, 31_2, 31_3 \ldots 31_m$, representing the identity of the row(s) whose contents are identical to the match word in the MATCH register 25. An AND gate 32 and an OR gate 33 are each coupled to the lines $28_1 - 28_m$, and each serves to produce a signal representing the ANDed and OR'd logical sum of the signals on these lines, respectively.

The CAM 10 shown in FIG. 1 is also configured with a WILD CARD register 34 which has a set of output lines $35_1, 35_2, 35_3 \ldots 35_n$ coupled to a separate one of the match lines $24_1, 24_2, 24_3 \ldots 24_n$. Depending on the bits of the word loaded into the wild card register, one or more of the signals on line $31_1 - 35_n$ will be ones. When the signal on each of the lines $35_1, 35_2, 35_3 \ldots 35_n$ of the WILD CARD register 34 is at a logic "1" level, the signal will mask the signal received on a corresponding one of the lines $24_1, 24_2, 24_3 \ldots 24_n$, respectively, from the MATCH register 25. By selecting the contents of the wield card register 34 to establish a logic "1" level on a selected one of the lines $24_1, 24_2, 24_3 \ldots 24_n$, corresponding bits of the match word in the MATCH register 25 can thus be masked.

The CAM 10, configured as described, is susceptible to a multiplicity of faults. The array 12 of the memory cells 14 is itself susceptible to: (a) "stuck-at" faults, (b) transition faults, (c) coupling faults, and (d) linked coupling and transition faults. A stuck-at fault occurred when the contents of a cell 14 remain stuck at either a "1" or a "0" regardless of the state of the bit previously written into the cell. A transition fault is said to occur when it is not possible to effect a change in state of the contents of a cell 14 from a "0" to a "1" or from a "1" to a "0" by writing a "1" and a "0, " respectively. A coupling fault occurs when the state of a bit in a cell 14 unintentionally changes because the bit in a cell in an adjacent row changes. At its name suggests, a linked transition and coupling fault is the combination of a transition fault and a coupling fault.

In addition to the memory cell array 12 being faulty, other portions of the CAM 10 may also be faulty. For instance, the decoder 21 may fail to access the addressed row of cells 14, or may access other rows in place of, or in addition to the one addressed. The encoder 30 may fail to output the address of each row of cells 14 (if any) which contains word matching the one in the MATCH register 25.

The MATCH register 25 may fail to supply the proper match word if the state of the signal on one or more of the match lines $24_1, 24_2, 24_3 \ldots 24_n$ remains stuck at a "0" or "1." The wild card register 32 may fail if the signal appearing on one or more to its output lines $34_1, 34_2, 34_3 \ldots 34_n$ is stuck-at "1" or "0." The OR gates 22 themselves may be faulty. For example one or more of the OR gates 22 may fail to output the proper signal in response to a separate one of the four possible combinations of input signals supplied thereto. Each of the DATA-IN and DATA-OUT register 16 and 19, respectively, may also be faulty due to a stuck-at type fault.

To completely test the CAM 10, all of the above-described faults must be detected. In accordance with the invention, a technique has been developed for complete testing of the CAM 10 to detect whether each type of fault is present. As will be described in greater detail below, the testing of the CAM 10 in accordance with the invention is carried out by executing a predetermined set of sequences of the write, match and read operations. During each write operation a preselected data word, from the group consisting of: (a) all ones, (b) all zeros, (c) a walking one in a zero word, and (d) a walking zero in a ones word, is written into a separate one of the rows of cells 14 in the array 12 of the CAM 10. Each match operation is carried out by matching a preselected data word, chosen from the group of four data words described above, to the word stored in each of the rows at the same time. Simultaneously with the matching operation, a read operation is performed and the contents (stored word) in an addressed row of cells 14 are read and checked to establish if the stored word corresponds to a predetermined one of the group of data words. The predetermined sequences of the write, match and read operations are selected to test all of the elements of the CAM 10 (i.e., the cell array 12, the decoder 21, the encoder 30, and the registers 16, 19, 25 and 34).

To facilitate execution of the appropriate sequences of the write, match and read operations and evaluation of the results thereof, the CAM 10 provided with a test system 36 comprised of the earlier-described AND and OR gates 32 and 33, an up/down counter 37, a test pattern generator 38, a comparator 40, a wild card generator 42, an AND gate 44, and an OR gate 46. All of the elements of the test system 36 are typically integrated with the elements of the CAM 10 in a single package (not shown). The up/down counter 37 of the test system 35, which is typically configured of ana up/down counter, serves to generate a count which is applied to the decoder 21, causing the decoder to address a separate one of the rows of cells 14 in the array 12 in accordance with the count. The test pattern generator 38 typically takes the form of a resigner which serves to supply both the DATA-IN and MATCH registers 16 and 25, respectively, with a separator one of the above-described data word types (i.e., (a) an al-zeros word, (b) an all-ones word, (c) a walking zero in a ones word, (d) or a walking one in a zero word).

The comparator 40 of the test system 36 serves to compare the signals present on the lines $31_1, 31_2, 31_3 \ldots 31_m$ to the count of the up/down counter 37 and output a bit which is indicative of whether the signals equal the count or not. The wild card generator 42 comprises a register which serves to supply the wild card register 34 of the CAM 10 with a string of all ones to test if the latter can correctly mask the match word. The AND and OR gates 44 and 46 are each coupled to the output of the DATA-OUT register 19 and serve to AND and OR, respectively, the bits of the word output on the bus 20 so as to compact the word into a pair of bits.

The system 36 tests the CAM 10 by causing the CAM to execute the following sequences of write, match and read operations listed in tabular form in Table II.

TABLE II

| | | | | |
|---|---|---|---|---|
| (1) | ↑$W^0$ | | | |
| (2) | ↑$M^{1/0}$ | $W^1$ | $W^0$ | $W^1$ |
| (3) | →$M^{0\rightarrow}$ | →($W^0$→$M^{0\rightarrow}$) | | $W^1$ |
| (4) | ↑$M^1$ | $W^0$ | $M^0$ | $W^1$ |
| (5) | ↓$M^1$ | $W^0$ | $W^1$ | $W^0$ |
| (6) | →$M^{1\rightarrow}$ | →($W^0$→$M^{1\rightarrow}$) | | $W^0$ |
| (7) | ↓$M^0$ | $W^1$ | $M^1$ | $W^0$ |

The symbols W and M signify a write and a match/read operation, respectively (the matching and reading operations being performed simultaneously). The superscripts $0, 1, 0\rightarrow$ and $1\rightarrow$ following the symbols W and M signify that the operation is carried out by writing or matching and reaching a word of all ones, a word of all zeros, a walking zero in a ones word, and a walking one in zeros word. Thus, for example, the write operation $W^0$ is carried out by writing a word of all zeros in a row addressed by the decoder 21. By the same token, the match/read operation $M^1$, for instance is carried out by matching a word of all ones to the words stored in each and every one of the rows of cells 14 while at the same time, the word stored in an addressed row of cells 14 is read and checked to establish if it is all ones. The match/read operation $M^{1/0}$ is carried out by matching a word of all ones to the words stored in the array 12 while reading and then analyzing the word stored in a addressed row of cells 14 to determine if it is all zeros. The arrows ( ↑ ) and ( ↓ ) signify that the operations of the sequences following the arrow are performed in succession on each row of cells 14 in the array 12, starting with the top row and the bottom row, respectively. The arrow (→) preceding sequences (3) and (6) indicates that each of these sequences is performed only on a single row of cells 14.

During the first sequence (1) of operations, a write operation ($W^0$) is carried out and a word of all zeros is written into each successive row of cells 14 in the array 12, stating with the top row in FIG. 1. In order to carry out the write operation ($W^0$), the up/down counter 37 supplies the decoder 21 with a count indicative of the address of the top row of cells 14 while, at the same time, the test pattern generator 38 supplies an all-eros word to the DATA-IN register 16. The word in the DATA-IN register 16 is then written into the addressed row of cells 14. After the write operation, the count of the up/down counter 37 is increased by unity, causing the decoder 21 to address the next successive row of cells 14, whereupon, the write operation $W^0$ is performed again to write an all-zeros word into the addressed row. The write operation $W^0$ of sequence (1) is carried out on each successive row of cells 14 to write a word of all zeros thereon.

During the second sequence (2), a match/read operation $M^{1/0}$ and three separate write operations ($W^1$, $W^0$, $W^1$) are performed in succession on each row of cells 14, starting with the top row. During the match/read operation $M^{1/0}$, a word of all ones is matched against the word in each of the rows of cells simultaneously. Such matching is accomplished by causing the test pattern generator 38 to output a word of all ones to the MATCH register 25, which in turn outputs each bit of the just-received match word on a corresponding one of the lines $24_1, 24_2 \ldots 24_n$. Depending on whether the bits of the word stored in each row of cells 14 are in fact all zeros, a "1" or "0" will appear on a particular one of the lines $28_1, 28_2, 28_3 \ldots 28_m$. In response to the signals on the lines $28_1, 28_2, 28_3 \ldots 28_m$, the encoder 30 outputs a signal on the lines $31_1, 31_2, 31_3 \ldots$, which signals collectively indicate the identity of the row (if any) whose stored word matches the matched word.

As the matching is occurring, a read operation is also performed, and the word stored in the row of cells 14 addressed by the decoder 21 is read and checked to determine if the word is a zero. The actual read operation is carried out by loading the word in the address row of cells 14 into the DATA-OUT register 19 and then outputting the word on the bus 20. The AND and OR gates 44 and 46 serve to AND and OR, respectively, the bits of the word appearing on the bus 20, yielding a pair of bits which, by themselves, yield sufficient information to analyze whether the word just read is all ones or all zeros. In this way, the AND and OR gates 44 and 46 advantageously serve to "compact," that is to say, reduce the multiplicity of bits of the just-read word.

After the match/read operation in sequence (2), a write operation $W^1$ is performed and a word of all ones is written into the row of cells currently addressed by the decoder 21. This operation is carried out by causing the test pattern generator 38 to load a word of all ones into the DATA-IN register 16 which, in turn, transfers the word to the currently addressed row of cells 14. Following the write operation $W^1$, a second write operation $W^0$ is then performed during which a word of all zeros is written into the currently addressed row in a manner similar to the previous write operation. Finally, during sequence (2) a write operation ($W^1$) is performed during which an all-ones word is written in the currently addressed row. The operations $M^{1/0}$, $W^1W^0$, and $W^1$ of sequence (2) are carried out successively on each row of cells 14 in the array 12.

Each time the match/read operation ($M^{1/0}$) is performed during sequence (2), the wild card generator 42 supplies the WILD CARD register 34 with a data string of all ones. The purpose in doing so is to reveal the faults, if any, associated with the wild card operation. When a "1" is present on each of the lines $24_1, 24_2, 24_3 \ldots 24_n$, all of the bits of the match word in the MATCH register 25 will be masked so that the outputs of The AND and OR gates 32 and 33, respectively, are both at a "1," signifying an "all match" condition. The failure of the AND and OR gates 32 and 33, respectively, to detect an all match condition during sequence (2) is indicative of a fault in either the wild card register 34 or in one of the XOR gates 22. During all other operations, the wild card register 34 produces a string of all zeros.

Following sequence (2), a third sequence of operations (sequence (3)) is performed. The first of the operations in sequence (3) is a match/read operation ($M^{0\rightarrow}$) during which a separate one of a stream of data words, obtained by "walking a zero through a ones word," is matched to the words stored the rows of cells 14. To accomplish such matching, the test pattern generator 38 successively generates a successive one of a set of data words 11111...0, 111...01, 111...011, 011....111. The generated data words each consist of a single "0" is an otherwise ones word with the "0" in each successively generated word being shifted one bit to the left from the previous word. The "1" appearing in each of the generated data words thus appears to "walk" through a word which is otherwise comprised of all ones. During this matching operation, only a single one of the words obtained by walking a "0" through a ones word is written into the MATCH register 25 for matching with the word stored in each row of the array. Upon each successive execution of this matching during sequence (3), the next successive word in the sequence obtained by walking a "0" through a ones word is written into the MATCH register 25 for matching against the words stored in the array 12. For each word in the sequence of the "walking zero," a no-match condition should occur, as indicated by a "0" output signal from the AND and OR gates 32 and 33, respectively.

At the same time matching of the "walking zeros word" is occurring, a read operation is also performed on an addressed row of cells 14 during which the stored word in the row is read and checked to determine if the word corresponds to the same word held in the MATCH register 25. The identity (address) of the particular row of cells 14 read during the match/read operation executed during sequence (3) is unimportant as long as a row of cells is read. As before, at the completion of each read operation, the AND and OR gates 44 and 46 each output a signal representative of the result obtained by ANDing and ORing the bits In the word just read. This first match/read operation $M^{0\rightarrow}$ of sequence (6) is repeated for each successive word obtained by walking a zero through a ones word.

Following the first match/read operation $M^0$, then the combination of a write operation $W^0$ and match/read operation $M^0$ (represented by the W and M in parentheses in Table II) is carried for each word obtained by walking a zero through a ones word. Thus, for each word so obtained, a write operation is performed and the word is written in the addressed row of cells 14. Thereafter, the same word is matched to the words in all of the rows. As the matching is occurring, the just-addressed row is read and the contents are checked for correspondence to the word just matched. Once each successive word in the sequence obtained by walking a zero through a ones word has been written and then matched (and the addressed row is read), the write and match/read operations are executed again for the next word in the sequence. At the completion of the operation $M^0$ and (W M)$^{0\rightarrow}$, a write operation $W^0$ is performed and word of all zeros is written into the addressed row to insure that the word in the row is all zeros.

Following sequence (3), a fourth sequence (sequence (4)) of the write and match/read operations is executed. As indicated in Table II, the first operation performed in sequence (4) is a match/read operation ($M^1$) during which an all-ones word is matched simultaneously to the words stored in the array 12. At the same time, a word is read from a successive row of cells 14 (starting with the top row in FIG. 1) and is thereafter analyzed to determine if the word is comprised of all ones. After the match/read operation, a write operation ($W^0$) is performed at which time a word of all zeros is written into the row of cells 14 just read. Next, a match/read operation ($M^0$) is executed and a word of all zeros is matched to the words stored in the array 12. At the same time, a read operation is performed and the word in the row upon which the write operation has been executed is read and checked to determine if the word is all zeros. The last operation in sequence (4) is a write operation ($W^1$) during which a word of all ones is written into the row just read during the previous match/read operation. The match/read and write operations ($M^1, W^0, M^0$ and $W^1$) of sequence (4) are performed in succession on each successively lower row of cells 14 in the array 12, starting with the top row until the operations have been performed on every row of cells.

Following sequence (4), a fifth sequence (sequence (5)) of the write and match/read operations is performed. The first operation in sequence (5) is a match/read operation ($M^1$) which is performed by matching a word of all ones to the words stored in the array 12. At the same time the matching is occurring, a read operation is also being performed during which the word in a successive row of cells is read and analyzed to determine if the word is comprised of all ones. As indicated by the downward arrow in Table II preceding the operations associated with sequence (5), the read operation executed during this sequence is performed on the last(-bottom) row of cells 14 first. Thus, at the outset of sequence (5), the counter 36 loads the decoder 21 with the address of this row, and upon each subsequent execution of the sequence, the counter supplies the decoder with a decreasing count.

After the match/read operation ($M^1$) is initially executed during sequence (5), the next operation executed in sequence (5) is a write operation ($W^0$) during which a word of all zeros is written into the row just read. Next, a write operation ($W^1$) is executed during which word of all ones is written into the same row into which word of all zeros has just been written. Following this write operation, a write operation ($W^0$) is executed during which a word of all zeros is written into the row. After sequence (5) of the match/read and write operations is performed on the bottom-most row of cells 14, the sequence is performed on the next higher row of cells in response to the decreasing count of the counter 36 and so on until all of the sequence of operations has been performed on each and every row.

The sequence (5) of the write and match/read operations is followed by a sixth sequence (6) of write and match/read operations. The sequence (6) is initiated by executing a match/read operation $M^1$ which is carried out by matching each successive word in a sequence obtained by walking a one through a word of all zeros to the words stored in the array. As each word in this sequence is matched, the same addressed row of cells 14 is read and the contents are checked for correspondence to the matched word. Once the match/read operation $M^1$ has been performed, the combination of a write and match/read operation (shown in parentheses in Table II) is carried out for each word obtained in the walking one sequence. Thus, each word obtained by walking a one through a zeros word is first written into the addressed row of cells 14. Thereafter, the same word is matched to the rows in the array 12, while simultaneously, the addressed row (which was the subject of the previous write operation) is read to check for the matched word. The write and match/read operations are executed for each successive word obtained by walking a one through a zeros word. The operations executed during sequence (6) are similar to those of sequence (3) described earlier except that in the latter sequence, a one is walked through a zeros word, rather than walking a zero through a ones word. At the completion of the operations $M^{1\rightarrow}$ and $(W\,M)^{1\rightarrow}$, a write operation ($W^1$) is executed so that the contents of the addressed row of cells are returned to all ones.

As will be described in greater detail below, the match/read operations $M^{0\rightarrow}$ and $M^{1\rightarrow}$ of sequences (3) and (6), respectively, are executed to test the match capability of the CAM 10. The write and match/read operations $(W\,M)^{0\rightarrow}$ of sequence (3) and the write and match/read operations $(W\,M)^{1\rightarrow}$ of sequence (6) are executed to test for certain faults in the AND and OR gates 44 and 46, respectively, which compact the data read from the array 12. While it is desirable to execute these particular operations, they could be omitted if no built-in self-test of the AND gate 44 and OR gate 46 were desired.

After the write operation $W^1$ in sequence (6) is executed, a seventh sequence (sequence (7)) of the match/read and write operations is performed. The first operation executed in sequence (7) is a match/read operation ($M^0$) during which a word of all zeros is matched against the word stored in each of the rows of cells 14. At the same time a read operation is performed on a successive row of cells, starting with the bottom row, and the contents (word) in this row are checked for correspondence to a word of all zeros. Following the match/read operation, a write operation ($W^1$) is executed and a word of all zeros is written into the row of cells just read. Thereafter, a subsequent match/read ($M^1$) operation is executed and a word of all ones is matched against all of the words stored in the array 12. At the same time, a read operation is executed and the contents of the row of cells 14 on which the previous write operation had been performed, are now read and checked for correspondence to a word of all ones. Following the match/read operation, a write operation ($W^0$) is performed and a word of all zeros is written into the row which has just been previously read. As indicated by the downward arrow associated with the operations executed during sequence (7), the operations are performed in succession on each next higher row of cells 14, starting with the bottom row first and finishing with the top row last.

The sequence of operations (1)–(7) is sufficient to diagnose all of the faults in the fault model of the CAM 10 given earlier. Consider first the possibility that a stuck-at "1" fault exists within the array 12. A stuck-at "1" fault in any cell 14 will manifest itself after execution of the write operation ($W^0$) of sequence (1) and the match/read operation ($M^{1/0}$) of sequence (2). Following each successive write operation ($W^0$) during sequence (1), the cells 14 in each row should contain a zero. Thus, during each successive match/read operation ($M^{1/0}$) of sequence (2), each word read out from the DATA-OUT register 19 should be all zeros, and the AND and OR gates 44 and 46 should both output a "0." If not, a stuck-at "1" fault is present.

A stuck-at "0" fault will manifest itself after successive execution of the write operation ($W^1$) of sequence (4) and the match/read operation ($M^1$) of sequence (5). After the write operation ($W^1$) of sequence (4) is successively executed, the cells 14 in each row should contain a "1" when read during successive execution of the match/read ($M^1$) operation of sequence (5). Thus, the AND and OR gates 44 and 46 should each output a "1" when each row of cells 14 is read. If not, then a stuck-at "0" fault exists.

A fault associated with one or more cells 14 in each row failing to transition from a "0" to a "1" will manifest itself upon successive execution of the match/read operation ($M^0$), the write operation ($W^1$), and the match/read operation ($M^1$) of sequence (4). By reading the contents of each successive row, then writing a word of all ones, and the reading the contents of the row, any cell 14 which had been at a zero and but had failed to transition to a "1" after the write operation $W^1$ will be revealed by a difference between the signals produced by the AND and OR gates 44 and 46. By the same token, a "1→0" transition fault will manifest itself by a difference between the signals of the AND and OR gates 44 and 46 following successive execution of the match/read ($M^1$), the write ($W^0$) and the match/read ($M^0$) operations of sequence (7).

A coupling fault, which occurs when the contents of one or more cells 14 in given row changes (from a "1" to "0" or vice versa) because of a change in a cell in an adjacent row will manifest itself during execution of the match/read operation $M^0$ and the write operation $W^1$ of sequence (4) and the subsequent execution of the match/read operation $M^1$ of sequence (5). As should be appreciated, upon successive execution of the match/read and write operations $M^0$ and $W^1$, respectively, of sequence (4), each row of cells 14 is first read (to verify that a word of zeros is present) and then a word of all ones is written in the row. Should one or more zeros appear in any of the subsequent rows of cells 14 as a consequence of the write operation $W^1$ performed on a previous row; such faults will manifest themselves upon execution of the match/read operation $M^1$ during sequence (5).

The match/read $M^1$ and write operations $W^0$ of sequence (5), when successively executed, serve to manifest a coupling fault of a "0" appearing in an ith row of cells 14 that should be all zeros as a result of writing a word of zeros in a jth row (where $i<j$). Similarly, the match/read operation $M^{1/0}$ and the write operation $W^1$ of sequence (2), when successively executed, will detect a coupling fault of a "1" appearing in the ith row of cells that should be all zeros as a result of writing a word of ones in the jth row.

An addressing fault occurs when the decoder 21 fails to properly address the correct row of cells 14 in the array 12. This type of fault will manifest itself upon successive execution of the match/read operation $M^1$ and the final write operation $W^0$ of sequence (5) and the match/read operation $M^{1/0}$ and the final write operation $W^1$ of sequence (2). Each time the write operation $W^0$ of sequence (2) is executed, a word of all zeros is written into a successive row of cells 14 that was previously filled with all ones. Should the decoder 21 be faulty and address a row that has not yet been written with zeros, then upon successive execution of the match/read operation $M^{1/0}$ of the sequence (2), the word read will be ones and not all zeros as expected. Hence, each of the AND and OR gates 44 and 46 will output a "1," indicating an addressing fault. In a similar fashion, each time the write operation $W^1$ of sequence (5) is performed, a word of all ones is written into a successive row of cells 14 that was previously filled with all zeros. Thus, an addressing fault will be detected, if, upon subsequent execution of the match/read operation $M^1$ of sequence (5), a word of all ones is read. Since the sequences (2) and (5) are executed successively on the rows of cells 14, starting with the top and the bottom row, respectively, any addressing fault that is present will be detected during the execution of these two sequences of write and match/read operations.

As indicated earlier, coupling and transition faults are not mutually exclusive of each other. Such faults can occur together and are referred to as linked coupling and transition faults. These types of faults will manifest themselves upon execution of sequences (2) and (5).

Detection of errors in the matching capability of the CAM 10 will also be revealed by execution of sequences (1)–(7) of the write and match/read operations. Consider a fault which arises upon a failure to obtain a match when an all-zero word in matched against all zeros in the array 12. When an all-zero word is input to the MATCH register (25), each of the AND and OR gates 32 and 33 will output a zero when a match occurs. Thus, during the match/read operation $M^0$ of sequence (7), a match of an all zeros word in the MATCH register 25 to all zeros in the array 12 can be detected by virtue of a "0" output by the AND and OR gates 32 and 33, respectively. Conversely, a match between an all-ones word in the MATCH register 25 to all ones in the array 12 can be detected upon execution of the match operation $M^1$ of sequence (4), since under "match" conditions a "1" will be output by both the AND and OR gates 32 and 33.

Detection of a no-match condition could be accomplished by matching an all-zeros word against all ones in the array 12 and by matching an all-ones word against all zeros in the array. However, this approach would not individually isolate the XOR gates 22 associated with a particular one of the lines $24_1, 24_2, 24_3 \ldots 24_n$ which is desirable. Such isolation is had, in accordance with the invention, by matching a "walking-zero" word $(M^{0\rightarrow})$ with the array contents during sequence (3) and by matching a "walking-ones" word with the array contents during sequence (6). By matching a "walking ones' and a "walking zero," during sequences (3) and (6), the XOR gates 22 associated with a separate one of the lines $24_1, 24_2, 24_3 \ldots 24_n$ will be tested line by line, a distinct advantage.

When the encoder 30 is faulty, it will fail to identify the correct address of the row of cells 14 whose contents match that of the match word. Detection of this type of fault is had by performing the write operation $W^1$ and the match/read operation $M^1$ during sequence (7). As the write operation $W^1$ is performed upon execution of sequence (7), a word of all ones is written into a row of cells which had previously contained all zeros. The rest of the array 12 also contains all zeros. During execution of the subsequent match/read operation $M^1$ of sequence (7), the encoder 30, when operating properly, should return the address of the row into which the word of ones had just been written since a match will exist with only this row. The failure to return the same address as that of the row of cells 14 just written will be sensed by the comparator 40 which, in turn, will indicate the presence of this type of fault.

Any fault in the wild card register 33 will be verified by causing the wild card generator 42 to load a word of all ones into the register to mask all the bits of the mask word during the match/read operation $M^{1/0}$ of sequence (2). With all of the bits of the match word masked, the AND gate 32 should indicate an all-match condition upon execution of the match/read operation if the wild card register 34 is operating properly. By the same token, when the wild card register 34 is supplied with all zeros during execution of the match/read operation $M^0$ of sequence (4) or (7), then a no-match condition should occur if the wild card register is operating properly.

An advantage of testing the CAM 10 with the sequences (1)–(7) of the write and match/read operations described above is that the AND and OR gates 44 and 46, which provide data compaction, can also be tested. A stuck-at "1" fault associated with the AND gate 44 will manifest itself during execution of the match/read segment of the operation $(W M)^{0\rightarrow}$ of sequence (3) after the write segment has been executed. A stuck-at zero fault will manifest itself upon execution of the match/read segment of the operation $M^1$ of sequence (4). A stuck-at "1" fault associated with the OR gate 46 will manifest itself upon execution of the match/read segment of the operation $(W M)^{1\rightarrow}$ of sequence (6) after the write segment has been executed. A stuck-at "0" fault will manifest itself upon execution of the match/read operation $M^0$ of sequence (7).

The AND and OR gates 32 and 33 which AND and OR the signals on the match lines $28_1, 28_2, 28_3 \ldots 28_n$ are also advantageously tested by execution of certain of the write and match/red operations in sequences (1)–(7). A stuck-at "1" within the AND gate 32 will manifest itself upon execution of the operations $W^0$, $M^0$, and $W^1$ during the sequence (4) whereas a stuck-at "0" fault is detected upon execution of the operations $M^1$ during the same sequence. A stuck-at "0" fault is detected upon within the OR gate 33 is manifested upon execution of the operations $W^1$, $M^1$ and $W^0$ of sequence (7) whereas a stuck-at "1" is revealed upon execution of the $M^{1\rightarrow}$ operation of sequence (6).

The foregoing describes a technique for thoroughly testing a content-addressable memory 10 by executing a predetermined sequence of write and match/read operations. During the write and match/read operations, a preselected one of a set of data words consisting of all zeros, all ones, a walking one in a zero word, and a walking zero in a ones word are written and matched/read, respectively, to test each element of the CAM 10.

It is to be understood that the above-described embodiments are merely illustrative of the principles of the invention. Various modifications and changes may be made thereto by those skilled in the art which will embody the principles of the invention and fall within the spirit and scope thereof.

I claim:

1. A method for testing every function of a content-addressable memory (CAM) comprised of a plurality of rows of memory cells, each row of cells identified by a corresponding address and each row of cells storing a word, and a plurality of exclusive OR (XOR) gates, each associated with a separate cell, a decoder for decoding the address of a row of memory cells into which a data word is to be written or from which a stored word is to be read, a match word register for storing a match word, and an encoder for determining the address of the row containing a word matching the match word, comprising the steps of:

performing a predetermined set of sequences of write and match/read operations on the rows of memory cells, each write operation performed by addressing a row of memory cells and writing a data word from a group whose bits consist of all zeros, all ones, a walking one in a word of otherwise all zero bits, and a walking zero in a word of otherwise all one bits, into the addressed row, and each match/read operation performed by matching a first preselected data word to the word stored in each of the rows of memory cells and by reading the word stored in the addressed row of memory cells and checking to ascertain whether the word stored in the row corresponds to a second preselected data word.

2. The method according to claim 1 wherein the preselected sequences of the write and match/read operations comprise the following seven sequences:

(a) (first sequence) performing a write operation $W^0$ on each successive row of memory cells, the write operation $W^0$ being performed by writing a word whose bits are all zeros into each successive row of memory cells;

(b) (second sequence) performing a match/read operation $M^{1/0}$, a write operation $W^1$, the write operation $W^0$, and a write operation $W^1$ in succession on each successive row of memory cells, the match/read operation $M^{1/0}$ performed by matching a word whose bits are all ones to the word stored in every row of memory cells while reading the word stored in the successive row of memory cells to ascertain if the word has all zero bits, and each of the write operations $W^1$ performed by writing a word whose bits are all ones into each successive row of memory cells;

(c) (third sequence) successively performing a match/read operation $M^{0\rightarrow}$ and then the write operation $W^1$ on a single row of memory cells, the match/read operation $M^{0\rightarrow}$ performed by matching each of a sequence of words, obtained by walking a zero through a word of otherwise all one bits, to the word stored in each successive row of memory cells, while successively reading the word stored in each successive row of memory cells to determine if the word stored corresponds to the particular word being matched;

(d) (fourth sequence) performing a match/read operation $M^1$, the write operation $W^0$, a match/read operation $M^0$ and the write operation $W^0$ in succession on each row of memory cells, the match/read operation $M^1$ performed by matching a word whose bits are all ones to the word stored in each successive row of memory cells while reading the word stored in each successive row to ascertain if the stored word has all one bits, and the match/read operation $M^0$ being performed by matching a word of all zero bits to each successive row of memory cells while reading the word stored in each successive row to ascertain if the stored word has all zero bits;

(e) (fifth sequence) performing the match/read operation $M^1$, the write operation $W^0$, the write operation $W^1$, and the write operation $W^0$ in succession on each successive row of memory cells;

(f) (sixth sequence) successively performing a match/read operation $M^{1\rightarrow}$ and then the write operation $W^0$ on a single row of memory cells, the match/read operation $M^{1\rightarrow}$ performed by matching each of a sequence of words, obtained by walking a one through a word of otherwise all zero bits, to all of the row of memory cells, while successively reading the word stored in the single row of memory cells to determine if the stored word corresponds to the particular word being matched; and (g) (seventh sequence) performing the match/read operation $M^0$, the write operation $W^1$, the match/read operation $M^1$ and the write operation $W^0$ in succession on each row of memory cells.

3. The method according to claim 2 wherein the rows of memory cells are tested by the steps of:

(a) performing the write operation $W^0$ of the first step sequence of operation successively on each row of memory cells;

(b) performing the match/read operation $M^{1/0}$ and the write operation $W^1$, the write operation $W^0$, and the write operation $W^1$ of the second sequence of operations successively on each row of memory cells;

(c) performing the match/read operation $M^1$, the write operation $W^0$ and the match/read operation $M^0$ on the fourth sequence of operations successively on each row of memory cells;

(d) performing the match/read operation $M^1$, the write operation $W^0$, the write operation $W^1$ and the write operation $W^0$ of the fifth sequence of operations successively on each row of memory cells; and (e) performing the match/read operation $M^0$, the write operation $W^1$, the match/read operation $M^1$ and the write operation of the seventh sequence of operations successively on each row of cells.

4. The method according to claim 2 wherein the encoder of the content-addressable memory is tested by executing the write operation $W^0$, the match/read operation $M^0$ and the write operation $W^1$ of the fourth sequence of operations successively on each row of cells.

5. The method according to claim 2 wherein the exclusive OR gates of the content-addressable memory are tested by the steps of:
   (a) performing the write operation $W^0$ of the first sequence of operations on each row of memory cells and the match/read operation $M^{1/0}$ of the second sequence of operations on each successive row of memory cells;
   (b) performing the write operation $W^1$ of the second sequence of operations on each row of cells and then performing the match/read operation $M^{0\rightarrow}$ of the third sequence of operations on a single row of memory cells;
   (c) performing the write operation $W^1$ of the third sequence of operations on each row of memory cells and then performing the match/read operation $W^1$ of the fourth sequence of operations; and
   (d) performing the write operation $W^0$ of the fourth sequence of write operation $W^1$, the operations on each row of memory cells and the performing the match/read operation $M^{1\rightarrow}$ of the fifth sequence of operations on the one row of memory cells.

6. The method according to claim 2 wherein the decoder is tested by the steps of:
   (a) performing the match/read operation $M^{1/0}$ and the last write operation $W^1$ of the fifth sequence of operations on each successive row of memory cells; and
   (b) performing the match/read operation $M^1$ and the last write operation $W^0$ of the fifth sequence of operations successively on each row of memory cells.

7. The method according to claim 2 wherein the CAM contains a wild card register for masking bits of a mask word in a mask register and wherein the wild card register is tested by the steps of:
   (a) applying a word of all ones the match wild card register while simultaneously performing the match/read operation $M^{1/0}$ of the second sequence of operations;
   (b) performing the match/read operation $M^1$ of the fourth sequence of operations.

8. A test system for testing a content-addressable memory (CAM) comprised of a plurality of rows of memory cells, each row of memory cells having an address associated therewith and each memory cell in each row having a corresponding, exclusive OR (XOR) gate, a decoder for decoding the address of a row of memory cells into which a data word is to be read or written, a match word register for storing a match word, and an encoder for determining the address of the row containing a word matching the match word, the test system comprising:
   an up/down counter coupled to the decoder for supplying a count to the decoder of the content addressable memory to address each of a successive row of memory cells;
   a test pattern generator coupled to the content-addressable memory for supplying the content-addressable memory with a plurality of data words from a group whose bits consist of all ones, all zeros, a walking one in a word of otherwise all zeros and a walking zero in a word of otherwise all ones;
   first means coupled to the content-addressable memory for compacting data read from the content-addressable memory;
   second means coupled to the content-addressable memory for compacting data indicative of the address of the rows containing a matching word; and
   a comparator coupled to the encoder of the content-addressable memory for comparing a match row address output thereby to a predetermined match row address.

9. The apparatus according to claim 8 wherein the first compactor means comprises:
   an AND gate coupled to the content-addressable memory for ANDing the contents of the data read from the content-addressable memory; and
   an OR gate coupled to the content-addressable memory for ORing the contents of the data read from the content-addressable memory.

10. The apparatus according to claim 8 wherein the second compacting means comprises:
   an AND gate coupled to the content-addressable memory for ANDing the data indicative of the addresses of the rows containing matching words; and
   an OR gate coupled to the content-addressable memory for ORing the data indicative of the addresses of the rows containing matching words.

11. The apparatus according to claim 8 wherein the content-addressable memory further includes a wild card resister for supplying a mask word to mask the match word and wherein the test system includes a wild card generator for supplying a word of all ones and a word of all zeros to test the match word register.

* * * * *